United States Patent
Song et al.

(10) Patent No.: US 11,860,498 B1
(45) Date of Patent: Jan. 2, 2024

(54) DISPLAY PANEL AND METHOD FOR MANUFACTURING THE SAME, AND DISPLAY DEVICE

(71) Applicant: HKC CORPORATION LIMITED, Shenzhen (CN)

(72) Inventors: Wenliang Song, Guangdong (CN); Baohong Kang, Guangdong (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/090,606

(22) Filed: Dec. 29, 2022

(30) Foreign Application Priority Data

Jul. 29, 2022 (CN) .......................... 202210910190.5

(51) Int. Cl.
| | | |
|---|---|---|
| G09G 3/36 | (2006.01) | |
| G02F 1/1368 | (2006.01) | |
| H01L 27/12 | (2006.01) | |
| G02F 1/1362 | (2006.01) | |

(52) U.S. Cl.
CPC ...... *G02F 1/1368* (2013.01); *G02F 1/136209* (2013.01); *H01L 27/127* (2013.01); *H01L 27/1222* (2013.01)

(58) Field of Classification Search
CPC ............. G02F 1/1368; G02F 1/136209; G02F 1/13624; G02F 1/134309; G02F 1/136286; G02F 1/136218; G02F 2201/508; G02F 1/136263; G02F 1/136245; G02F 1/136213; G02F 1/134345; H01L 27/1222; H01L 27/127; G09G 3/3688; G09G 3/3677;

(Continued)

(56) References Cited

U.S. PATENT DOCUMENTS

2005/0122441 A1* 6/2005 Shimoshikiryoh ........................ G02F 1/13624
349/38
2009/0261338 A1* 10/2009 Tsubata ................. H01L 27/124
257/E33.053

(Continued)

FOREIGN PATENT DOCUMENTS

| CN | 104252076 A | 12/2014 |
|---|---|---|
| CN | 107437400 A | 12/2017 |

(Continued)

OTHER PUBLICATIONS

The first office action issued in corresponding CN application No. 202210910190.5 dated Feb. 11, 2023.

*Primary Examiner* — Hoan C Nguyen
(74) *Attorney, Agent, or Firm* — HAUPTMAN HAM, LLP (57) ABSTRACT

A display panel is provided in the disclosure. The display panel includes at least one first region and at least one second region. The display panel includes a first substrate assembly. The first substrate assembly includes multiple first driving transistors located in the at least one first region and multiple second driving transistors located in the at least one second region. A first source or a first drain of the first driving transistor has a first width, and the first source and the first drain are spaced apart by a first spacing. A second source or a second drain of the second driving transistor has a second width, and the second source and the second drain are spaced apart by a second spacing. A ratio of the second width to the second spacing is greater than a ratio of the first width to the first spacing.

20 Claims, 5 Drawing Sheets

(58) Field of Classification Search
CPC ......... G09G 3/3607; G09G 2320/0257; G09G 2300/0426; G09G 3/3655; G09G 2300/043; G09G 3/3614; G09G 2300/0823; G09G 3/3648; G09G 2320/0223; G09G 2320/028; G09G 2300/0443; G09G 2320/0276; G09G 2300/0876; G09G 2320/0247; G09G 2300/0447; G09G 3/2074

See application file for complete search history.

(56) References Cited

U.S. PATENT DOCUMENTS

| | | | | |
|---|---|---|---|---|
| 2010/0141849 | A1* | 6/2010 | Enda | G02F 1/13624 445/24 |
| 2015/0154932 | A1* | 6/2015 | Lee | G02F 1/1368 345/206 |
| 2015/0293413 | A1* | 10/2015 | Aoyama | G02F 1/1368 257/72 |
| 2017/0076688 | A1* | 3/2017 | Kim | G02F 1/13624 |
| 2019/0326268 | A1 | 10/2019 | Tseng et al. | |

FOREIGN PATENT DOCUMENTS

| | | |
|---|---|---|
| CN | 110137236 A | 8/2019 |
| CN | 110456575 A | 11/2019 |
| CN | 110634932 A | 12/2019 |
| CN | 111180492 A | 5/2020 |
| CN | 113196160 A | 7/2021 |
| CN | 113327515 A | 8/2021 |
| CN | 114755854 A | 7/2022 |

* cited by examiner

FIG. 4 provide the first substrate and form on the first substrate the multiple first driving transistors and the multiple second driving transistors, to form the first substrate assembly, where the first source or the first drain of each first driving transistor has the first width, the first source and the first drain are spaced apart by the first spacing, the second source or the second drain of each second driving transistor has the second width, the second source and the second drain are spaced apart by the second spacing, and the ratio of the second width to the second spacing is greater than the ratio of the first width to the first spacing — S10 provide the second substrate and form on one side of the second substrate the at least one first common electrode and the at least one second common electrode, to form the second substrate assembly — S20 align the first substrate assembly and the second substrate assembly to form the display panel, where the first common electrode and the second common electrode face the first substrate assembly — S30

FIG. 5

```
┌─────────────────────────────────────────────────┐
│ form on the first substrate multiple first gates, multiple second │
│ gates, and the insulating layer, where the insulating layer covers the │  S11
│ multiple first gates and the multiple second gates on the first │
│                    substrate                     │
└─────────────────────────────────────────────────┘
                          ↓
┌─────────────────────────────────────────────────┐
│ form on the insulating layer multiple first active layers, multiple │
│ second active layers, multiple first sources, multiple second │
│ sources, multiple first drains, multiple second drains, and the │
│ passivation layer, where the passivation layer covers the multiple │  S12
│ first active layers, the multiple second active layers, the multiple │
│ first sources, the multiple second sources, the multiple first drains, │
│ and the multiple second drains on the insulating layer │
└─────────────────────────────────────────────────┘
                          ↓
┌─────────────────────────────────────────────────┐
│ form the color resist layer and the planarization layer sequentially │  S13
│ on a surface of the passivation layer away from the insulating layer │
└─────────────────────────────────────────────────┘
                          ↓
┌─────────────────────────────────────────────────┐
│ define multiple via holes which penetrate the planarization layer │
│ and the color resist layer and extend into the passivation layer, such │
│ that the multiple first drains and the multiple second drains are │
│ exposed from the passivation layer, and form multiple pixel │  S14
│ electrodes, where the multiple pixel electrodes extend into the via │
│ holes from a surface of the planarization layer away from the color │
│ resist layer and are electrically connected with the multiple first │
│ drains and the multiple second drains │
└─────────────────────────────────────────────────┘
```

DISPLAY PANEL AND METHOD FOR MANUFACTURING THE SAME, AND DISPLAY DEVICE

CROSS-REFERENCE TO RELATED APPLICATIONS

This application claims priority under 35 U.S.C. § 119(a) to Chinese Patent Application No. 202210910190.5, filed Jul. 29, 2022, the entire disclosure of which is incorporated herein by reference.

TECHNICAL FIELD

This disclosure relates to the field of display technology, in particular to a display panel and a method for manufacturing the same, and a display device having the display panel.

BACKGROUND

Liquid crystal displays play a more and more important role in people's life and work. The liquid crystal display has advantages of thin body, low power consumption, and low price, and thus is widely used. The liquid crystal display generally includes a liquid crystal display panel and a backlight module. The backlight module provides backlight for the liquid crystal display panel.

The backlight module consisted of Mini Light-Emitting Diodes (Mini LED) only supports a small-sized display panel. When the Mini LED backlight module provides the backlight for a large-sized liquid crystal display panel, it is generally necessary to splice multiple lamp panels to form a large-sized Mini LED backlight module. However, a splicing-gap region (or called edge joint region) often exists between adjacent lamp panels. Since the splicing-gap region is free of any obstruction, light emitted by the lamp panel cannot be reflected back when irradiated on the splicing-gap region, resulting in a low brightness of the splicing-gap region. Therefore, a dark zone with a low brightness will appear on the liquid crystal display panel, which will affect a display quality of the display.

Therefore, for those skill in the art, the problem that the dark zone appears on the display panel due to the nonuniform backlight provided by the backlight module is to be solved.

SUMMARY

In a first aspect, embodiments of the disclosure provide a display panel. The display panel includes at least one first region and at least one second region, where a brightness of light received at the first region is greater than a brightness of light received at the second region. The display panel includes a first substrate assembly and a second substrate assembly opposite to the first substrate assembly. The first substrate assembly includes a first substrate, multiple first driving transistors, and multiple second driving transistors, where the multiple first driving transistors and the multiple second driving transistors are disposed on one side of the first substrate facing the second substrate assembly, the multiple first driving transistors are located in the at least one first region, and the multiple second driving transistors are located in the at least one second region. The first driving transistor includes a first source and a first drain spaced apart from the first source, the second driving transistor includes a second source and a second drain spaced apart from the second source, the first source or the first drain has a first width, the first source and the first drain are spaced apart by a first spacing, the second source or the second drain has a second width, the second source and the second drain are spaced apart by a second spacing, and a ratio of the second width to the second spacing is greater than a ratio of the first width to the first spacing.

In a second aspect, embodiments of the disclosure provide a display device. The display device includes the display panel of the first aspect and a backlight module configured to provide light for the display panel.

In a third aspect, embodiments of the disclosure provide a method for manufacturing a display panel. The method is for manufacturing the display panel of the first aspect and includes the following. The first substrate is provided and the multiple first driving transistors and the multiple second driving transistors are formed on the first substrate, to form the first substrate assembly, where the first source or the first drain of each first driving transistor has the first width, the first source and the first drain are spaced apart by the first spacing, the second source or the second drain of each second driving transistor has the second width, the second source and the second drain are spaced apart by the second spacing, and the ratio of the second width to the second spacing is greater than the ratio of the first width to the first spacing. The second substrate is provided and the at least one first common electrode and the at least one second common electrode are formed on one side of the second substrate, to form the second substrate assembly. The first substrate assembly and the second substrate assembly are aligned to form the display panel, where the first common electrode and the second common electrode face the first substrate assembly.

BRIEF DESCRIPTION OF THE DRAWINGS

To describe technical solutions of embodiments of the disclosure more clearly, a brief description of drawings required in the embodiments will be given below. Apparently, the drawings described below are some embodiments of the disclosure, and for those of ordinary skill in the art, other drawings may be obtained from these drawings without creative effort.

DETAILED DESCRIPTION

To facilitate understanding of the disclosure, the disclosure will be described in details below with reference to the related drawings. The preferred implementations of the disclosure are shown in the drawings. However, the disclosure may be implemented in many different forms and is not limited to the implementations described herein. Rather, these implementations are provided for a thorough and complete understanding of the disclosure.

The following descriptions of various embodiments are with reference to the accompanying figures to illustrate the specific embodiments that can be implemented by the disclosure. The serial numbers themselves, such as "first", "second", etc., for the components herein are only used to distinguish the described objects, and do not have any order or technical meaning. Further, the "connection" and "coupling" mentioned in the disclosure, unless otherwise specified, include both direct and indirect connection (coupling). Directional terms mentioned in the disclosure, such as "upper", "lower", "front", "rear", "left", "right", "inner", "outer", "side", etc., are merely references of directions of the accompanying drawings. Accordingly, the directional terms are used for better and clearer description and understanding of the disclosure, rather than indicating or implying that the referred device or element must have a particular orientation, be constructed and operate in a particular orientation. Therefore, it should not be construed as a limitation on the disclosure.

In the description of the disclosure, it should be noted that, unless otherwise expressly specified and limited, the terms "installed", "connected", and "coupled" should be understood in a broad sense. For example, it may be a fixed connection, a detachable connection, or an integral connection; a mechanical connection; a direct connection, an indirect connection through an intermediate medium, or an internal communication between two components. For those of ordinary skill in the art, the specific meanings of the above terms in the disclosure can be understood in specific situations. It should be noted that the terms "first", "second" and the like in the description, claims, and drawings of the disclosure are used to distinguish different objects, rather than to describe a specific order. In addition, the terms "include", "can include", "contain", or "can contain" used in the disclosure indicate the existence of the disclosed corresponding functions, operations, elements, etc., and do not limit other one or more more functions, operations, components, etc. Furthermore, the terms "include" or "contain" mean corresponding features, numbers, steps, operations, elements, components, or combinations thereof disclosed in the specification, without excluding the presence or addition of one or more other features, numbers, steps, operations, elements, components, or combinations thereof, and are intended to cover the non-exclusive inclusion. It should also be understood that "at least one" as described herein means one or more such as one, two, three, or the like and "multiple" means at least two such as two, three, or the like, unless otherwise specificly defined.

Unless otherwise defined, all technical and scientific terms used herein have the same meaning as commonly understood by one of ordinary skill in the technical field to which the disclosure belongs. The terms used herein in the specification of the disclosure are merely for describing the implementations but are not intended to limit the disclosure.

Figure 1:
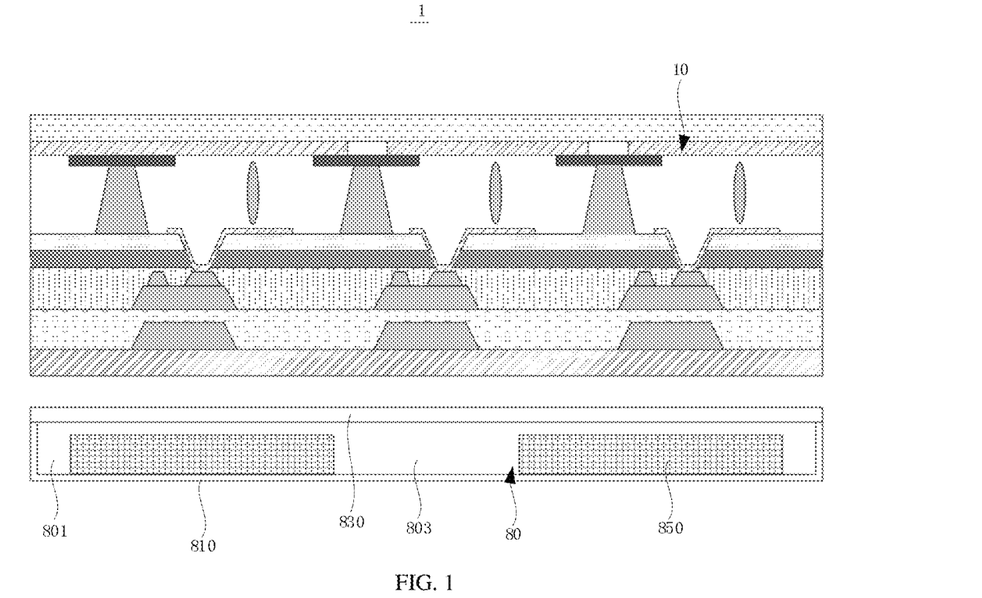
FIG. 1 is a schematic diagram of a layer structure of a display device disclosed in embodiments of the disclosure.

Referring to FIG. 1, FIG. 1 is a schematic diagram of a layer structure of a display device disclosed in embodiments of the disclosure. The display device 1 provided in implementations of the disclosure can at least include a display panel 10 and a backlight module 80 that are stacked. The display panel 10 is located at a light-exiting side of the backlight module 80. The display panel 10 is used to display images under light emitted by a light source provided by the backlight module 80.

Understandably, the display device 1 can be applied to electronic devices including, but not limited to, tablets, laptops, desktops, and the like. According to embodiments of the disclosure, the type of the display device 1 is not limited, and those skilled in the art can design accordingly according to specific use requirements of the display device 1, which will not be repeated herein.

In exemplary implementations, the display device 1 further includes other necessary components and elements such as a driver board, a power board, a high-voltage board, a key control board, etc. For those skilled in the art, other components and elements can be set according to specific types and actual functions of the display device 1, which will not be repeated herein.

In implementations of the disclosure, referring to FIG. 1, the backlight module 80 can at least include a backplane 810, an optical film assembly 830, and lamp panels 850. The optical film assembly 830 is installed on the backplane 810 and encloses an accommodating space 801 with the backplane 810. The lamp panels 850 are disposed in the accommodating space 801 and are installed on the backplane 810. The lamp panels 850 are for emitting light, and the optical film assembly 830 is for making light emitted by the light source provided by the backlight module 80 more uniform and improving the brightness of the light source provided by the backlight module 80.

In exemplary implementations, the lamp panels 850 are spaced apart from one another, and two adjacent lamp panels 850 are spaced apart by a splicing-gap region 803. The brightness of the splicing-gap region 803 is lower than that of the region where the lamp panel 850 is located. It can be understood that, since the lamp panels 850 are physically spliced together, it is hard to achieve zero splicing-gap. Therefore, the splicing-gap region 803 exists between two adjacent lamp panels 850.

In exemplary implementations, the number of the lamp panels 850 can be between 2 to 10, for example,2, 5, 8, 10, or the like. The specific number of the lamp panels 850 can be determined according to the size of the display panel 10 and the size of the lamp panel 850, which is not specifically limited in the disclosure. Accordingly, the number of the splicing-gap regions 803 can be multiple, which is not specifically limited in the disclosure.

In exemplary implementations, the optical film assembly 830 may at least include a diffusion sheet for improving the brightness uniformity of the light source and a prism sheet for improving the brightness of the light source.

In exemplary implementations, the backlight module 80 may also include other necessary components and elements such as a reflective sheet, an adhesive frame, a border, etc.

For those skilled in the art, other components and elements can be set according to specific types and actual functions of the backlight module 80, which will not be repeated herein.

In exemplary implementations, the backlight module 80 may be a direct-lit backlight module. Each lamp panel 850 may include multiple Mini Light-Emitting Diode (Mini LEDs) distributed in a matrix.

In exemplary implementations, the display panel 10 can be a display panel based on Polymer-Stabilized Vertical Alignment (PSVA) technology. The PSVA technology can include Photo Spacer on Array (POA) technology for disposing the photo spacer on the array substrate and Color-Filter on Array (COA) technology for integrating the color resist layer with the array substrate.

Figure 2:
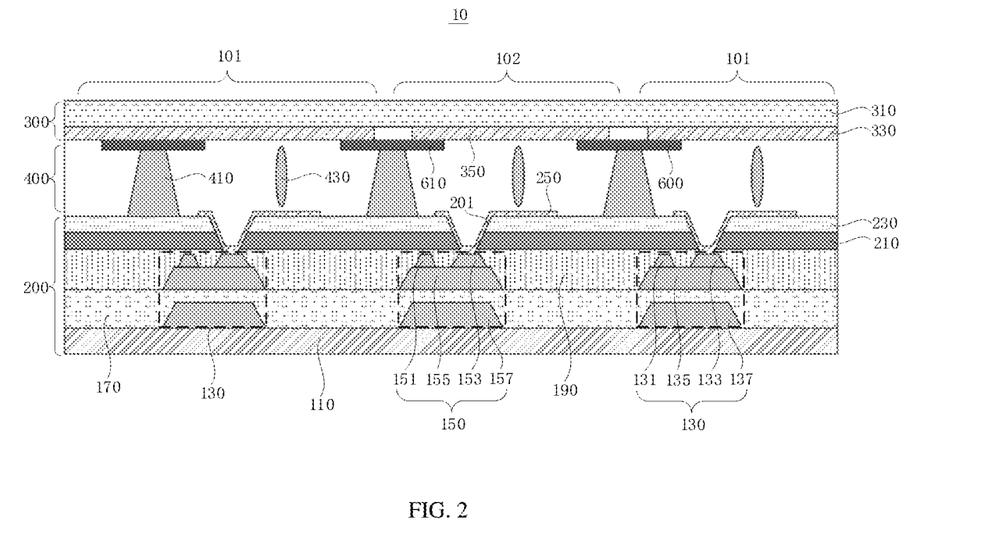
FIG. 2 is a schematic diagram of a layer structure of a display panel disclosed in embodiments of the disclosure.

Referring to FIG. 2, FIG. 2 is a schematic diagram of a layer structure of a display panel disclosed in embodiments of the disclosure. In embodiments of the disclosure, the display panel 10 has at least one first region 101 and at least one second region 102. The first region 101 correspond to the region where the lamp panel 850 is located and the second region 102 corresponds to the splicing-gap region 803. That is, an orthographic projection of the first region 101 on the backplane 810 corresponds to an orthographic projection of the lamp panel 850 on the backplane 810 and an orthographic projection of the second region 102 on the backplane 810 corresponds to an orthographic projection of the splicing-gap region 803 on the backplane 810. The brightness of the light emitted by the light source received at the first region 101 is greater than the brightness of the light emitted by the light source received at the second region 102.

In implementations of the disclosure, the display panel 10 can at least include a first substrate assembly 200 and a second substrate assembly 300 disposed opposite to the first substrate assembly 200. The first substrate assembly 200 can at least include a first substrate 110, multiple first driving transistors 130 and multiple second driving transistors 150. The multiple first driving transistors 130 and the multiple second driving transistors 150 are disposed on one side of the first substrate 110 facing the second substrate assembly 300, the multiple first driving transistors 130 are located in the first region 101, the multiple second driving transistors 150 are located in the second region 102. That is, an orthographic projection of the first driving transistor 130 on the first substrate 110 is within an orthographic projection of the first region 101 on the first substrate 110, and an orthographic projection of the second driving transistor 150 on the first substrate 110 is within an orthographic projection of the second region 102 on the first substrate 110.

Figure 3:
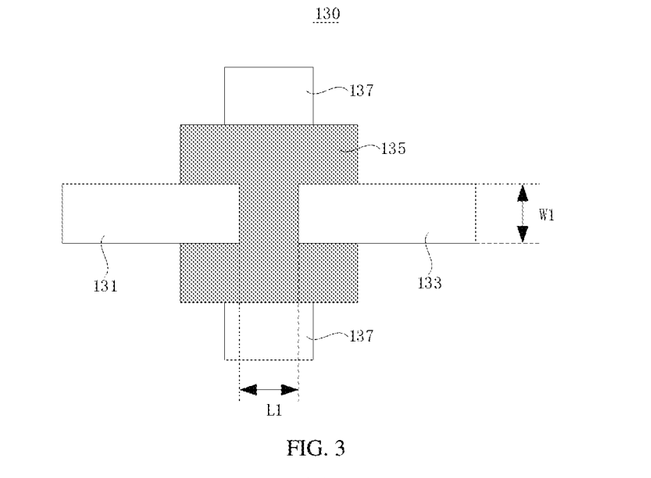
FIG. 3 is a schematic structural diagram of a first driving transistor of the display panel disclosed in the second embodiment of the disclosure.
Figure 4:
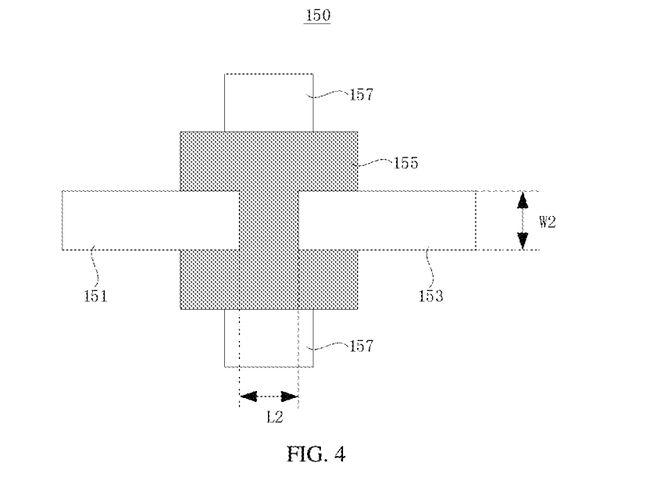
FIG. 4 is a schematic structural diagram of a second driving transistor of the display panel disclosed in the second embodiment of the disclosure.

Specifically, referring to FIG. 3 and FIG. 4, FIG. 3 is a schematic structural diagram of a first driving transistor of the display panel disclosed in the second embodiment of the disclosure, and FIG. 4 is a schematic structural diagram of a second driving transistor of the display panel disclosed in the second embodiment of the disclosure. The first driving transistor 130 includes a first source 131 and a first drain 133 spaced apart from the first source 131, and the second driving transistor 150 includes a second source 151 and a second drain 153 spaced apart from the second source 151. The first source 131 or the first drain 133 has a first width W1, and the first source 131 and the first drain 133 are spaced apart by a first spacing L1. The second source 151 or the second drain 153 has a second width W2, and the second source 151 and the second drain 153 are spaced apart by a second spacing L2. A ratio of the second width W2 to the second spacing L2 is greater than a ratio of the first width W1 to the first spacing L1. As such, an on-state current (Ion) flowing through the second driving transistor 150 is greater than an on-state current (Ion) flowing through the first driving transistor 130.

In exemplary implementations, the width of the first source 131 is equal to the width of the first drain 133, and the width of the second source 151 is equal to the width of the second drain 153.

In exemplary implementations, the first substrate assembly 200 can be an array substrate for controlling electrical signals, and the second substrate assembly 300 can be a color substrate for displaying colors.

As illustrated in FIG. 2, in implementations of the disclosure, the display panel 10 further includes a liquid crystal layer 400, where the liquid crystal layer 400 is disposed between the first substrate assembly 200 and the second substrate assembly 300. The liquid crystal layer 400 includes multiple Post Spacers (PS) 410 arranged in an array and liquid crystals 430, where each liquid crystal 430 is disposed between adjacent post spacers.

Specifically, there is a potential difference between the first substrate assembly 200 and the second substrate assembly 300, such that different preset electric fields can be formed between the first substrate assembly 200 and the second substrate assembly 300. The liquid crystal 430 deflects under the action of the preset electric fields, such that intensities of light transmitted through the display panel 10 are different, to achieve adjustment of a brightness of the display device 1. Understandably, if the potential difference between the first substrate assembly 200 and the second substrate assembly 300 is different, the deflection state of the liquid crystal 430 is different.

When a longitudinal direction of the liquid crystal 430 is perpendicular to a direction of the preset electric field, the light emitted by the backlight module 80 which can pass through the display panel 10 is minimum, that is, a transmittance of the display panel 10 is minimum. When the longitudinal direction of the liquid crystal 430 is parallel to the direction of the preset electric field, the light emitted by the backlight module 80 which can pass through the display panel 10 is maximum, that is, the transmittance of the display panel 10 is maximum. The transmittance is a ratio of a brightness of the light-exiting surface of display panel 10 to the brightness of the light emitted by the light source provided by backlight module 80.

Understandably, the on-state current (Ion) of the second driving transistor 150 flowing through the second region 102 is greater than the on-state current (Ion) of the first driving transistor 130 flowing through the first region 101. Within the same time, the quantity of charged charge in the second region 102 is greater than that in the first region 101, such that the second region 102 has an electric field strength greater than the first region 101. Furthermore, an angle between the longitudinal direction of the liquid crystal 430 in the second region 102 and the direction of the preset electric field is less than an angle between the longitudinal direction of the liquid crystal 430 in the first region 101 and the direction of the preset electric field. As such, the transmittance of the second region 102 is greater than the transmittance of the first region 101, to compensate for the difference between the intensity of the light received at the first region 101 and the intensity of the light received at the second region 102, to further make the brightness of the light-exiting side of the second region 102 consistent with the brightness of the light-exiting side of the first region 101.

As illustrated in FIG. 2, in exemplary implementations, the display panel 10 further includes a Black Matrix (BM) layer 600, where the black matrix layer 600 is disposed at one side of the second substrate assembly 300 facing the liquid crystal layer 400. The black matrix layer 600 can at least include multiple light shielding blocks 610 arranged in an array, and the light shielding block 610 is disposed at one side of the post spacer 410 facing the second substrate assembly 300. The light shielding block 610 is used for shielding light, to prevent light passing through adjacent sub-pixel units from interfering with each other, to improve the contrast of the display panel 10.

In other implementations of the disclosure, the black matrix layer 600 can be disposed at one side of the first substrate assembly 200 facing the liquid crystal layer 400, which is not limited in the disclosure.

In conclusion, the display panel 10 of implementations of the disclosure has the at least one first region 101 and the at least one second region 102, where the brightness of the light received at the first region 101 is greater than the brightness of the light received at the second region 102. The display panel 10 can at least include the first substrate assembly 200. The first substrate assembly 200 can at least include the first substrate 110, the multiple first driving transistors 130, and the multiple second driving transistors 150, where the multiple first driving transistors 130 are located in the first region 101 and the multiple second driving transistors 150 are located in the second region 102 (corresponding to the splicing-gap region 803). The first driving transistor 130 include the first source 131 and the first drain 133 which are spaced apart, and the second driving transistor 150 includes the second source 151 and the second drain 153 which are spaced apart. The first source 131 or the first drain 133 has the first width W1, and the first source 131 and the first drain 133 are spaced apart by the first spacing L1. The second source 151 or the second drain 153 has the second width W2, and the second source 151 and the second drain 153 are spaced apart by the second spacing L2. The ratio of the second width W2 to the second spacing L2 is greater than the ratio of the first width W1 to the first spacing L1. As such, the on-state current (Ion) flowing through the second driving transistor 150 is greater than the on-state current (Ion) flowing through the first driving transistor 130. Since the on-state current (Ion) flowing through the second driving transistor 150 is greater than the on-state current (Ion) flowing through the first driving transistor 130, the transmittance of the second region 102 (corresponding to the splicing-gap region 803) is greater than the transmittance of the first region 101, to compensate for the difference between the intensity of the light received at the first region 101 and the intensity of the light received at the second region 102, to further make the brightness of the light-exiting side of the second region 102 consistent with the brightness of the light-exiting side of the first region 101, ensuring display uniformity of the display panel 10.

In implementations of the disclosure, the ratio of the second width W2 to the second spacing L2 can be greater than or equal to 4 and less than 7, for example, 4, 4.9, 5, 6.5, 6.9, or other values, which is not limited in the disclosure. The ratio of the first width W1 to the first spacing L1 can be greater than or equal to 3 and less than or equal to 4, for example, 3, 3.2, 3.5, 3.8, 4, or other values, which is not limited in the disclosure.

In exemplary implementations, the second region 102 can include a middle portion (or called middle region) and edge portions (or called edge regions) at both sides of the middle portion, i.e., the edge portion is closer to the lamp panel 850 than the middle portion, and the edge portion is the joint of the second region 102 and the first region 101. The brightness of light received by the middle portion is less than the brightness of light received by the edge portion, and the brightness of the light received by the edge portion is gradually decreased in a direction from the first region 101 to the edge portion.

In exemplary implementations, the ratio of the first width W1 of the first driving transistor 130 in the first region 101 to the first spacing L1 is defined as a first ratio, a ratio of the second width W2 of the second driving transistor 150 in the edge portion to the second spacing L2 is defined as a second ratio, and a ratio of the second width W2 of the second driving transistor 150 in the middle portion to the second spacing L2 is defined as a third ratio, where the third ratio is greater than the second ratio, the second ratio is greater than the first ratio, and the second ratio is gradually increased in the direction from the first region 101 to the edge portion. As such, sawtooth sense of light transition at the joint of the second region 102 and the first region 101 can be eliminated. For example, the first ratio of the first width W1 of the first driving transistor 130 in the first region 101 to the first spacing L1 is 3, the third ratio of the second width W2 of the second driving transistor 150 in the middle portion to the second spacing L2 is 5, and thus the second ratio of the second width W2 of the second driving transistor 150 in the edge portion to the second spacing L2 is between 3 and 5, and the second ratio corresponding to the second driving transistor 150 close to the middle portion is greater than the second ratio corresponding to the second driving transistor 150 close to the first region 101.

In exemplary implementations, the second width W2 is greater than the first width W1 and the second spacing L2 is equal to the first spacing L1; or the second width W2 is equal to the first width W1 and the second spacing L2 is less than the first spacing L1; or the second width W2 is greater than the first width W1 and the second spacing L2 is less than the first spacing L1.

In implementations of the disclosure, referring to FIG. 2 and FIG. 3, the first driving transistor 130 further includes a first active layer 135 and a first gate 137. The first gate 137 is disposed on the first substrate 110 and is attached to the first substrate 110, the first active layer 135 is disposed at one side of the first gate 137 away from the first substrate 110, and both the first source 131 and the first drain 133 are disposed at one side of the first active layer 135 away from the first gate 137 and are spaced apart.

In implementations of the disclosure, referring to FIG. 2 and FIG. 4, the second driving transistor 150 further includes a second active layer 155 and a second gate 157. The second gate 157 is disposed on the first substrate 110 and is attached to the first substrate 110, the second active layer 155 is disposed at one side of the second gate 157 away from the first substrate 110, and both the second source 151 and the second drain 153 are disposed at one side of the second active layer 155 away from the second gate 157 and are spaced apart.

Specifically, each of the first active layer 135 and the second active layer 155 is made of multiple different types of semiconductors, and each of the first active layer 135 and the second active layer 155 has a depletion layer with high resistance. A bias voltage is applied to the first gate 137, to thin the first active layer 135, such that the first source 131 and the first drain 133 form a conductive path through the first active layer 135. A bias voltage is applied to the second gate 157, to thin the second active layer 155, such that the second source 151 and the second drain 153 form a conductive path through the second active layer 155.

In exemplary implementations, each of the first active layer 135 and the second active layer 155 can be made of polysilicon or metal oxide semiconductor.

In implementations of the disclosure, the first substrate assembly 200 further includes an insulating layer (for example, Gate Insulator, GI) 170 and a Passivation Layer (PV) 190. The insulating layer 170 is disposed on the first substrate 110, and covers the first gate 137 and the second gate 157 on the first substrate 110. The passivation layer 190 is disposed at one side of the insulating layer 170 away from the first substrate 110, that is, the first substrate 110, the insulating layer 170, and the passivation layer 190 are sequentially stacked, the first gate 137 and the second gate 157 are disposed at one side of the insulating layer 170 close to the first substrate 110, and the passivation layer 190 covers the first source 131, the first drain 133, the first active layer 135, the second source 151, the second drain 153, and the second active layer 155 on the insulating layer 170. The insulating layer 170 is used to insulate the first active layer 135 and first gate 137 and insulate the second active layer 155 and the second gate 157. The passivation layer 190 is used to protect the first source 131, the first drain 133, the first active layer 135, the second source 151, the second drain 153, and the second active layer 155 from oxidation and corrosion.

In exemplary implementations, the first active layer 135 and the second active layer 155 are located on the surface of the insulating layer 170 away from the first substrate 110.

In implementations of the disclosure, referring to FIG. 2, the first substrate assembly 200 further includes a Color Resist (CR)layer 210 and a planarization layer 230. The color resist layer 210 is disposed at one side of the passivation layer 190 away from the insulating layer 170, and the planarization layer 230 is disposed at one side of the color resist layer 210 away from the passivation layer 190. The color resist layer 210 is used to display colors under the light resource provided by the backlight module 80. The planarization layer 230 is configured to flatten a surface of the first substrate assembly 200 facing the liquid crystal layer 400, so that the post spacer 410 of the liquid crystal layer 400 is attached to the first substrate assembly 200.

In exemplary implementations, the color resist layer 210 includes a red color resistance(s), a green color resistance(s), and a blue color resistance(s) arranged in intervals, where the red color resistance displays red light under the light source provided by the backlight module 80, the green color resistance displays green light under the light source provided by the backlight module 80, and the blue color resistance displays blue light under the light source provided by the backlight module 80. Color display is achieved by controlling brightness of the red light, the green light, and the blue light.

In exemplary implementations, each of the insulating layer 170 and the passivation layer 190 can be made of silicon nitride, and the planarization layer 230 can be made of Perfluoroalkoxy (PFA), silicon nitride, or silicon oxide.

In implementations of the disclosure, referring to FIG. 2, the first substrate assembly 200 defines multiple via holes 201, where the multiple via holes 201 are in one-to-one correspondence with the first driving transistors 130 and the second driving transistors 150. The via hole 201 penetrates the planarization layer 230 and the color resist layer 210 and extends through a part of the passivation layer 190, such that the first drain 133 of the first driving transistor 130 exposes from the passivation layer 190 and the second drain 153 of the second driving transistor 150 exposes from the passivation layer 190.

In implementations of the disclosure, referring to FIG. 2, the first substrate assembly 200 further includes multiple pixel electrodes 250, where the multiple pixel electrodes 250 extend from a surface of the planarization layer 230 away from the color resist layer 210 into the via holes 201, and are in contact with the first drains 133 and the second drains 153, such that the first drain 133 is electrically connected with the pixel electrode 250 and the second drain 153 is electrically connected with the pixel electrode 250.

In exemplary implementations, the pixel electrodes 250 and the via holes 201 are the same in number, that is, one pixel electrode 250 is disposed in one via hole 201, and one pixel electrode 250 is in contract with one first drain 133 or one second drain 153.

In implementations of the disclosure, referring to FIG. 2, the second substrate assembly 300 can at least include a second substrate 310, at least one first common electrode 330, and at least one second common electrode 350. The first common electrode 330 and the second common electrode 350 are disposed at one side of the second substrate 310 facing the first substrate assembly 200 and are spaced apart, and the first common electrode 330 is located in the first region 101 and the second common electrode 350 is located in the second region 102. That is, the orthographic projection of the first common electrode 330 on the second substrate 310 is located in the first region 101, and the orthographic projection of the second common electrode 350 on the second substrate 310 is located in the second region 102.

Understandably, the potential of the second common electrode 350 is lower than the potential of the first common electrode 330, and potentials of the pixel electrodes 250 are uniform. A voltage applied to the liquid crystal layer 400 in the second region 102 is greater than a voltage applied to the liquid crystal layer 400 in the first region 101. An electric field strength between the second common electrode 350 and the pixel electrode 250 in the second region 102 is greater than that between the first common electrode 330 and the pixel electrode 250 in the first region 101. An angle between the longitudinal direction of the liquid crystal 430 in the second region 102 and the direction of the preset electric field is less than an angle between the longitudinal direction of the liquid crystal 430 in the first region 101 and the direction of the preset electric field, such that the transmittance of the second region 102 is greater than the transmittance of the first region 101, to compensate for the difference between the intensity of the light received at the first region 101 and the intensity of the light received at the second region 102, to further make the brightness of the light-exiting side of the second region 102 consistent with the brightness of the light-exiting side of the first region 101.

In exemplary implementations, the distance between the first common electrode 330 and the second common electrode 350 is greater than 0 and is less than 2 um, for example, 0.1 um, 0.5 um, 0.7 um, 1 um, 1.5 um, 1.8 um, 2 um, or other values, which is not limited in the disclosure.

In exemplary implementations, each of the first common electrode 330 and the second common electrode 350 is made of Indium Tin Oxide (ITO).

Understandably, referring to FIG. 2, to not affect display of the display panel 10, the periphery of the second common electrode 350 is set to correspond to the position of the post spacer 410.

In exemplary implementations, the first common electrode 330 is coupled with a driving chip (not shown) through the first chip-on-film (not shown), and the second common electrode is coupled with the driving chip (not shown) through the second chip-on-film (not shown), to achieve separate control of the potential of the first common electrode 330 and the potential of the second common electrode 350.

In exemplary implementations, the array substrate common electrode in the first region 101 is coupled with the driving chip through a third chip-on-film, and the array substrate common electrode in the second region 102 is coupled with the driving chip through the third chip-on-film. The driving chip controls different potentials of the first common electrode and the second common electrode, to control different voltage differences in the first region and the second region, so that the second region has a greater transmittance, to make the brightness of the light-exiting side of the second region 102 is consistent with the brightness of the light-exiting side of the first region 101. Further, since the driving chip control potentials of the first common electrode and the second common electrode, combined with the differential design of the thin film transistor in the first region and the thin film transistor in the second region, better effect can be achieved, such that the brightness of the light-exiting side of the second region 102 and the brightness of the light-exiting side of the first region 101 are more uniform.

In exemplary implementations, the first common electrode in the first region 101 and the array substrate common electrode in the first region 101 are electrically connected by a Au dot process, and the second common electrode in the second region 102 and the array substrate common electrode in the second region 102 are electrically connected by a Au dot process. The array substrate is coupled with the driving chip through the chip-on-film. The driving chip controls the potentials on the first substrate assembly and the second substrate assembly through the above paths, to control different voltage differences in the first region and the second region. As such, the second region has a greater transmittance, to make the brightness of the light-exiting side of the second region 102 is consistent with the brightness of the light-exiting side of the first region 101.

In exemplary implementations, the driving chip can be coupled with a scan-drive circuit, a data drive circuit, and the like, to control the display panel through the scan-drive circuit and the data drive circuit.

Understandably, in technical solutions of the disclosure, between the display panel 10 and the backlight module 80, there is no need to add a photomask for consistency of the brightness of the light received at the first region 101 and the brightness of the light received at the second region 102. Thus, according to the technical solutions of the disclosure, the cost can be saved and the dark zone on the display panel 10 can be accurately and effectively alleviated, such that the display device 1 has a better display quality. Meanwhile, when driving the first driving transistor 130 and the second driving transistor 150 of the disclosure, no additional wiring is required, and electronic materials such as the existing COF and source driving board (XB) can be shared.

In conclusion, the display panel 10 of implementations of the disclosure has the at least one first region 101 and the at least one second region 102, where the brightness of the light received at the first region 101 is greater than the brightness of the light received at the second region 102. The display panel 10 can at least include the first substrate assembly 200. The first substrate assembly 200 can at least include the first substrate 110, the multiple first driving transistors 130, and the multiple second driving transistors 150, where the multiple first driving transistors 130 are located in the first region 101 and the multiple second driving transistors 150 are located in the second region 102 (corresponding to the splicing-gap region 803). The first driving transistor 130 include the first source 131 and the first drain 133 which are spaced apart, and the second driving transistor 150 includes the second source 151 and the second drain 153 which are spaced apart. The first source 131 or the first drain 133 has the first width W1, and the first source 131 and the first drain 133 are spaced apart by the first spacing L1. The second source 151 or the second drain 153 has the second width W2, and the second source 151 and the second drain 153 are spaced apart by the second spacing L2. The ratio of the second width W2 to the second spacing L2 is greater than the ratio of the first width W1 to the first spacing L1. As such, the on-state current flowing through the second driving transistor 150 is greater than the on-state current flowing through the first driving transistor 130. The display panel further includes the second substrate assembly 300, where the second substrate assembly 300 includes the second substrate 310, at least one first common electrode 330 and at least one second common electrode 350. The potential of the second common electrode 350 is lower than the potential of the first common electrode 330. Since the on-state current flowing through the second driving transistor 150 is greater than the on-state current flowing through the first driving transistor 130, and the potential of the second common electrode 350 is lower than the potential of the first common electrode 330, the transmittance of the second region 102 can be greater than the transmittance of the first region 101, to compensate for the difference between the intensity of the light received at the first region 101 and the intensity of the light received at the second region 102, to further make the brightness of the light-exiting side of the second region 102 (corresponding to the splicing-gap region 803) consistent with the brightness of the light-exiting side of the first region 101, ensuring display uniformity of the display panel 10.

Figure 5:
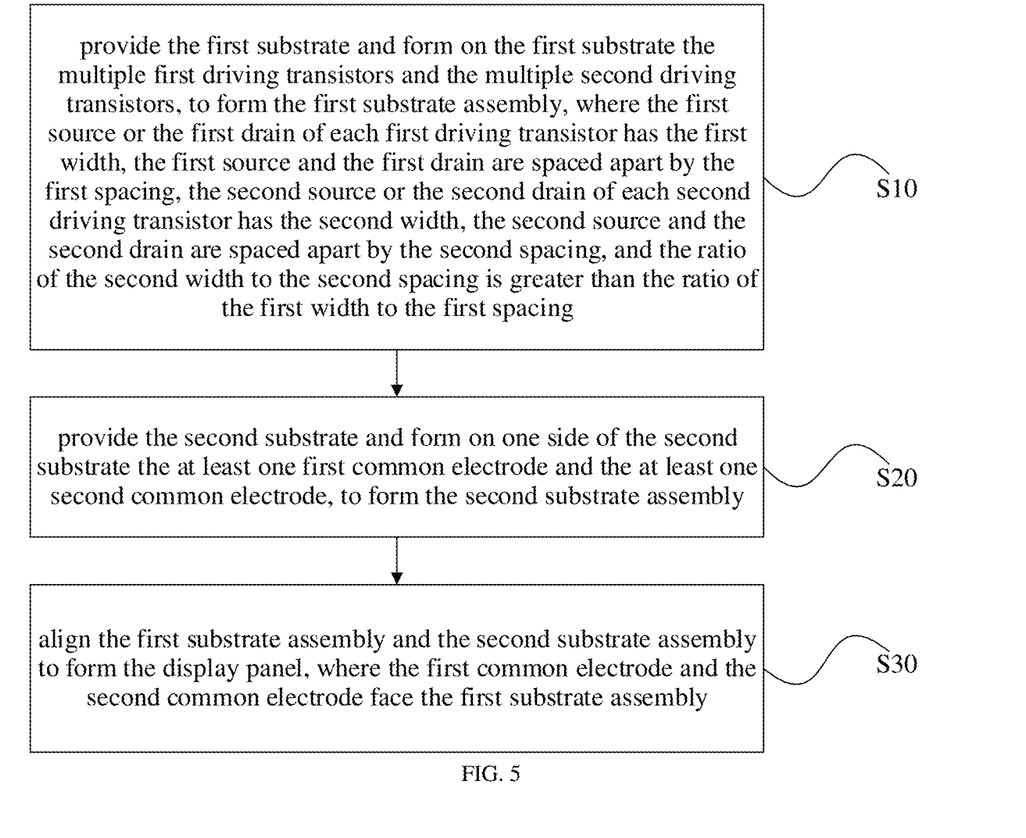
FIG. 5 is a schematic flow chart of a method for manufacturing a display panel disclosed in embodiments of the disclosure.

Based on the same inventive concept, embodiments of the disclosure further provide a method for manufacturing a display panel, configured to manufacture the display panel 10 of FIG. 2 to FIG. 4. For contents related to display panel in the method for manufacturing the display panel in embodiments, reference is made to the description of the display panel of the second embodiment, which is not limited herein. FIG. 5 is a schematic flow chart of the method for manufacturing a display panel disclosed in embodiments of the disclosure. The method can at least include the following.

S10, the first substrate 110 is provided and the multiple first driving transistors 130 and the multiple second driving transistors 150 are formed on the first substrate 110, to form the first substrate assembly 200, where the first source 131 or the first drain 133 of each first driving transistor 130 has the first width W1, the first source 131 and the first drain 133 are spaced apart by the first spacing L1, the second source 151 or the second drain 153 of each second driving transistor 150 has the second width W2, the second source 151 and the second drain 153 are spaced apart by the second spacing L2, and the ratio of the second width W2 to the second spacing L2 is greater than the ratio of the first width W1 to the first spacing L1.

Figure 6:
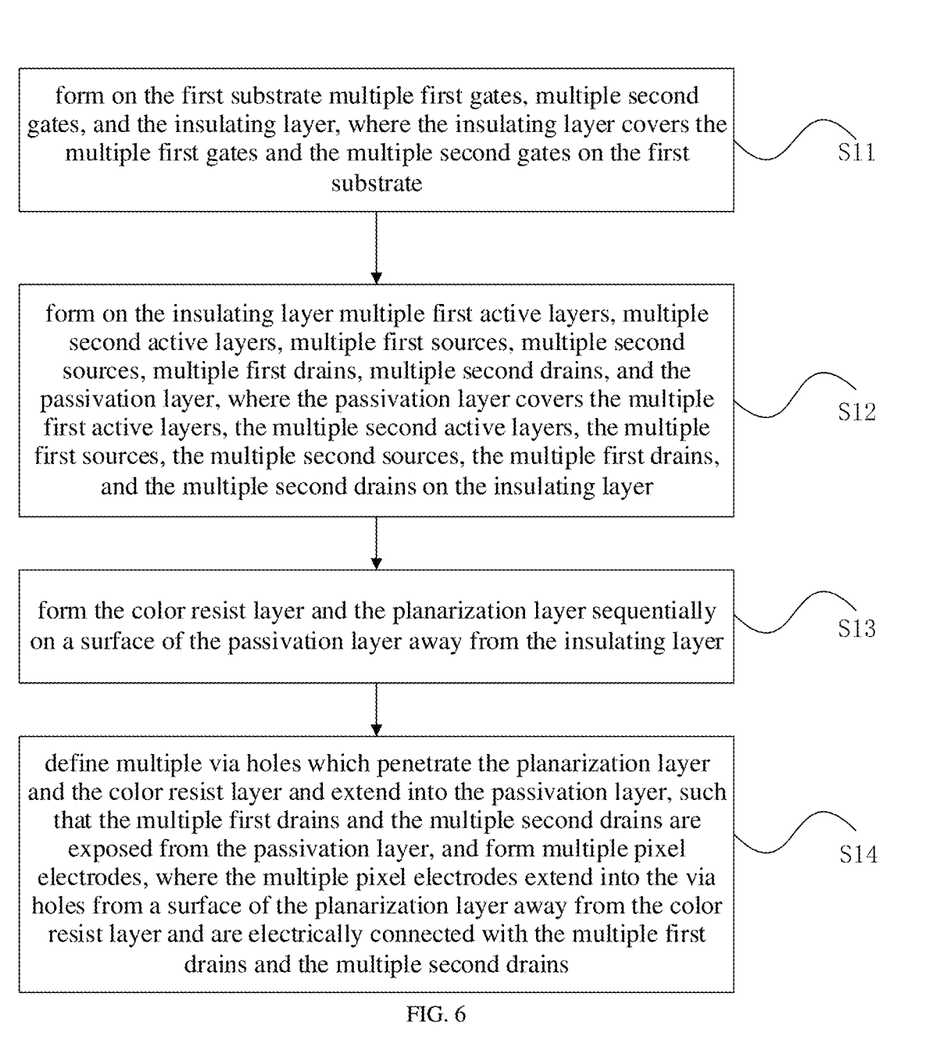
FIG. 6 is a schematic flow chart of S10 of the method for manufacturing the display panel disclosed in embodiments of the disclosure.

In implementations of the disclosure, referring to FIG. 6, FIG. 6 is a schematic flow chart of S10 of the method for manufacturing the display panel disclosed in embodiments of the disclosure. S10 can at least include the following.

S11, multiple first gates 137, multiple second gates 157, and the insulating layer 170 are formed on the first substrate 110, where the insulating layer 170 covers the multiple first gates 137 and the multiple second gates 157 on the first substrate 110.

Figure 7:
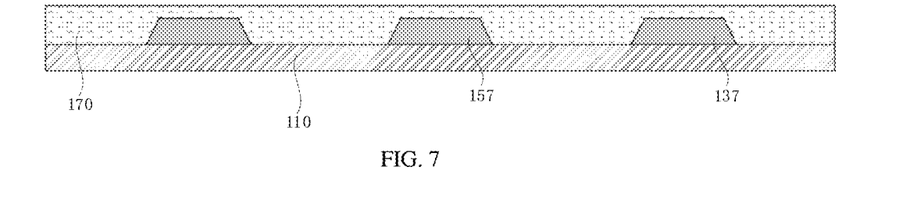
FIG. 7 is a schematic diagram of a corresponding structure formed in S11 of the method for manufacturing the display panel disclosed in embodiments of the disclosure.

Specifically, referring to FIG. 7, FIG. 7 is a schematic diagram of a corresponding structure formed in S11 of the method for manufacturing the display panel disclosed in embodiments of the disclosure. The multiple first gates 137 and the multiple second gates 157 are formed on the first substrate 110 through coating process, and the multiple first gates 137 and the multiple second gates 157 are arranged in an array on the first substrate 110. Then, through the coating process, the insulating layer 170 is formed on one side of the first gate 137 away from the first substrate 110, one side of the second gate 157 away from the first substrate 110, and the first substrate 110. The coating process includes steps of material coating, photoresist coating, development, etching, photoresist removal, and the like.

S12, multiple first active layers 135, multiple second active layers 155, multiple first sources 131, multiple second sources 151, multiple first drains 133, multiple second drains 153, and the passivation layer 190 are formed on the insulating layer 170, where the passivation layer 190 covers the multiple first active layers 135, the multiple second active layers 155, the multiple first sources 131, the multiple second sources 151, the multiple first drains 133, and the multiple second drains 153 on the insulating layer 170.

Figure 8:
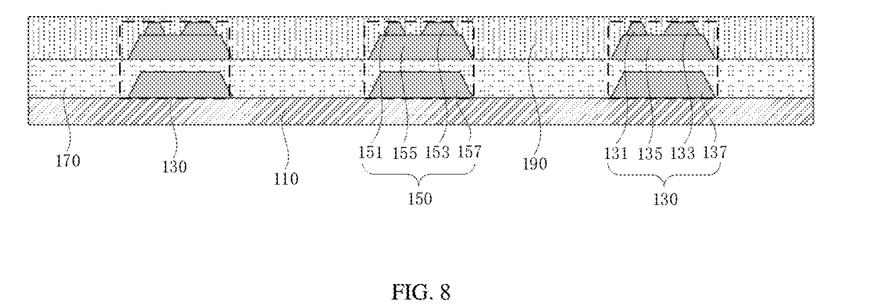
FIG. 8 is a schematic diagram of a corresponding structure formed in S12 of the method for manufacturing the display panel disclosed in embodiments of the disclosure.

Specifically, referring to FIG. 8, FIG. 8 is a schematic diagram of a corresponding structure formed in S12 of the method for manufacturing the display panel disclosed in embodiments of the disclosure. Through the coating process, the multiple first active layers 135 and the multiple second active layers 155 are formed on a surface of the insulating layer 170 away from the first substrate 110. Through the coating process, the first source 131 and the first drain 133 are formed on a surface of the first active layer 135 away from the insulating layer 170, and the second source 151 and the second drain 153 are formed on a surface of the second active layer 155 away from the insulating layer 170. Through the coating process, the passivation layer 190 is formed on a surface of the insulating layer 170 away from the first substrate 110, a surface of the first source 131 away from the first active layer 135, a surface of the first drain 133 away from the first active layer 135, a surface of the second source 151 away from the second active layer 155, and a surface of the second drain 153 away from the first active layer 135.

In implementations of the disclosure, one first source 131, one first drain 133, one first active layer 135, and one first gate 137 constitute one first driving transistor 130, and one second source 151, one second drain 153, one second active layer 155, and one second gate 157 constitute one second driving transistor 150.

In implementations of the disclosure, the first active layer 135 and the second active layer 155 are located on the surface of the insulating layer 170 away from the first substrate 110, the first active layer 135 corresponds to the first gate 137 in location, and the second active layer 155 corresponds to the second gate 157 in location. That is, an orthographic projection of the first active layer 135 on the first substrate 110 is within an orthographic projection of the first gate 137 on the first substrate 110, and an orthographic projection of the second active layer 155 on the first substrate 110 is within an orthographic projection of the second gate 157 on the first substrate 110. The first source 131 and the first drain 133 are located on the surface of the first active layer 135 away from the insulating layer 170, and the first source 131 and the first drain 133 are spaced apart. The second source 151 and the second drain 153 are located on the surface of the second active layer 155 away from the insulating layer 170, and the second drain 153 and the second source 151 are spaced apart.

In exemplary implementations, when forming the multiple first sources 131, the multiple first drains 133, the multiple second sources 151, and the multiple second drains 153 through mask plate exposure, it is possible to add lens focus or astigmatism on one side of the mask, or to add an anti-reflection film on one side of the mask to enhance the transmittance and make the exposure intensity greater, or to add an anti-transmission film on one side of the mask to reduce the transmittance and make the exposure intensity smaller, to make the exposure size decrease or increase accordingly. As such, the width of the first source 131, the width of the first drain 133, the width of the second source 151, and the width of the second drain 153 can be changed, and the distance between the first source 131 and the first drain 133 and the distance between the second source 151 and the second drain 153 can be changed.

S13, the color resist layer 210 and the planarization layer 230 are sequentially formed on a surface of the passivation layer 190 away from the insulating layer 170.

Figure 9:
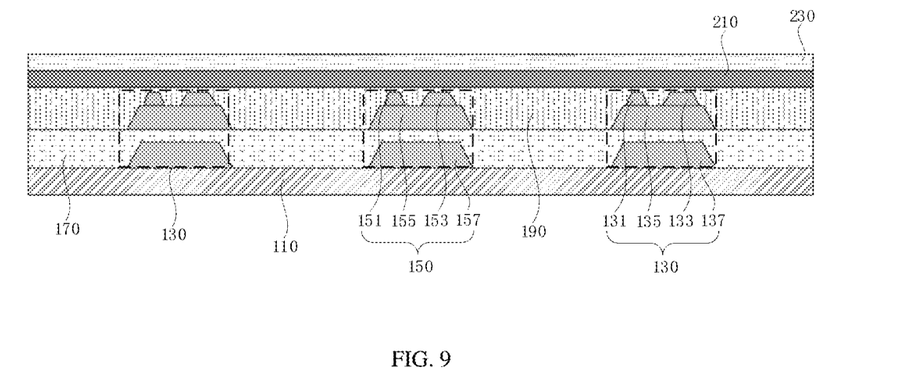
FIG. 9 is a schematic diagram of a corresponding structure formed in S13 of the method for manufacturing the display panel disclosed in embodiments of the disclosure.

Specifically, referring to FIG. 9, FIG. 9 is a schematic diagram of a corresponding structure formed in S13 of the method for manufacturing the display panel disclosed in embodiments of the disclosure. Through the coating process, the color resist layer 210 is formed on the surface of the passivation layer 190 away from the insulating layer 170. Through the coating process, the planarization layer 230 is formed on a surface of the color resist layer 210 away from the passivation layer 190.

S14, multiple via holes 201 which penetrate the planarization layer 230 and the color resist layer 210 and extend into the passivation layer 190 are defined, to make the multiple first drains 133 and the multiple second drains 153 expose from the passivation layer 190, and multiple pixel electrodes 250 are formed, where the multiple pixel electrodes 250 extend into the via holes 201 from a surface of the planarization layer 230 away from the color resist layer 210 and are electrically connected with the multiple first drains 133 and the multiple second drains 153.

Figure 10:
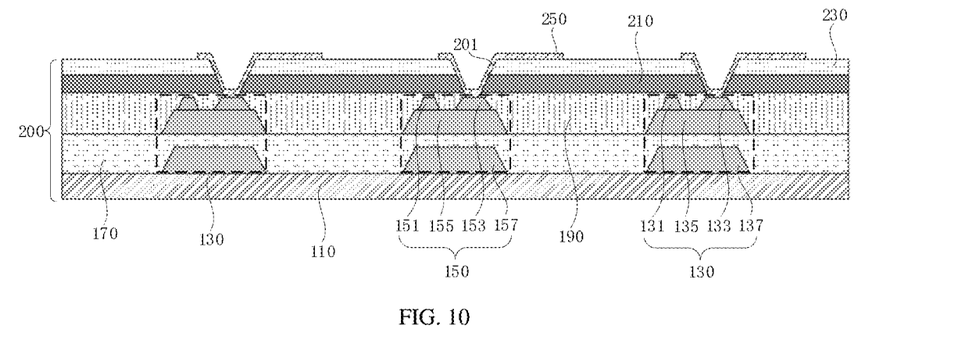
FIG. 10 is a schematic diagram of a corresponding structure formed in S14 of the method for manufacturing the display panel disclosed in embodiments of the disclosure.

Specifically, referring to FIG. 10, FIG. 10 is a schematic diagram of a corresponding structure formed in S14 of the method for manufacturing the display panel disclosed in embodiments of the disclosure. Through the coating process, the surface of the passivation layer 190 close to the color resist layer 210 defines the multiple via holes 201. Through the sputtering process, the multiple pixel electrodes 250 are formed in the via holes 201 and on the surface of the planarization layer 230 away from the color resist layer 210, and the pixel electrode 250 extends into the via hole 201 from the surface of the planarization layer 230 away from the color resist layer 210 and is electrically connected with the first drain 133 or the second drain 153.

In implementations of the disclosure, the multiple via holes 201 are in one-to-one correspondence with the first driving transistors 130 and the second driving transistors 150. The via hole 201 penetrates the planarization layer 230 and the color resist layer 210, and extends through a part of the passivation layer 190, such that the first drain 133 of the first driving transistor 130 exposes from the passivation layer 190 and the second drain 153 of the second driving transistor 150 exposes from the passivation layer 190. The pixel electrode 250 extends into the via hole 201 from the surface of the planarization layer 230 away from the color resist layer 210, and is in contact with the first drain 133 or the second drain 153. One via hole 201 corresponds to one pixel electrode 250.

S20, the second substrate 310 is provided and the at least one first common electrode 330 and the at least one second common electrode 350 are formed on one side of the second substrate 310, to form the second substrate assembly 300.

Figure 11:
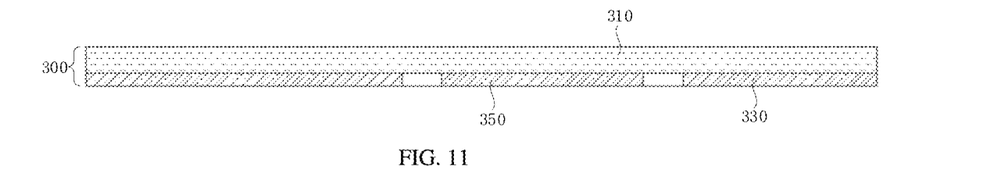
FIG. 11 is a schematic diagram of a corresponding structure formed in S20 of the method for manufacturing the display panel disclosed in embodiments of the disclosure.

Specifically, referring to FIG. 11, FIG. 11 is a schematic diagram of a corresponding structure formed in S20 of the method for manufacturing the display panel disclosed in embodiments of the disclosure. Through sputtering process, the at least one first common electrode 330 and the at least one second common electrode 350 are formed at one side of the second substrate 310, and the first common electrode 330 and the second common electrode 350 are spaced apart.

Understandably, the order of forming the first substrate assembly 200 and forming the second substrate assembly 300 can be adjusted, and the adjustment of the order does not affect the preparation of the display panel. In embodiments of the disclosure, the first substrate assembly 200 is formed first as example. In other implementations, the second substrate assembly 300 can be formed first, which is not limited herein.

S30, the first substrate assembly 200 and the second substrate assembly 300 are aligned to form the display panel 10, where the first common electrode 330 and the second common electrode 350 face the first substrate assembly 200.

Specifically, referring to FIG. 2, the first substrate assembly 200 faces the second substrate assembly 300, and the pixel electrode 250 of the first substrate assembly 200 faces the second substrate assembly 300 and the first common electrode 330 and the second common electrode 350 of the second substrate assembly 300 face the first substrate assembly 200. The liquid crystal layer 400 is formed on one side of the first substrate assembly 200 facing the second substrate assembly 300 or on one side of the second substrate assembly 300 facing the first substrate assembly 200. The first substrate assembly 200, the second substrate assembly 300, and the liquid crystal layer 400 are aligned in vacuum to form the display panel 10.

In implementations of the disclosure, the first common electrode 330 corresponds to the first driving transistor 130 in location and the first common electrode 330 and the first driving transistor 130 are in the first region 101. The second common electrode 350 corresponds to the second driving transistor 150 and the second common electrode 350 and the second driving transistor 150 are in the second region 102. That is, an orthographic projection of the first driving transistor 130 on the first substrate 110 is within an orthographic projection of the first common electrode 330 on the first substrate 110, and an orthographic projection of the second driving transistor 150 on the first substrate 110 is within an orthographic projection of the second common electrode 350 on the first substrate 110.

Understandably, aligning the first substrate assembly 200 and the second substrate assembly 300 refers to a process of aligning the first substrate assembly 200 and the second substrate assembly 300 in vacuum and bonding the first substrate assembly 200 and the second substrate assembly 300 with a frame adhesive.

In conclusion, the method for manufacturing the display panel provided in embodiments of the disclosure includes the following. The first substrate 110 is provided and the multiple first driving transistors 130 and the multiple second driving transistors 150 are formed on the first substrate 110, to form first substrate assembly 200, where the first driving transistor 130 includes the first source 131 and the first drain 133, the second driving transistor 150 includes the second source 151 and the second drain 153, the first source 131 or the first drain 133 has the first width W1, the distance between the first source 131 and the first drain 133 is the first spacing L1, the second source 151 or the second drain 153 has the second width W2, the distance between the second source 151 and the second drain 153 is the second spacing L2, and the ratio of the second width W2 to the second spacing L2 is greater than the ratio of the first width W1 to the first spacing L1. The second substrate 310 is provided and the at least one first common electrode 330 and the at least one second common electrode 350 are formed on one side of the second substrate 310, to form the second substrate assembly 300. The first substrate assembly 200 and the second substrate assembly 300 are aligned to form the display panel 10, where the first common electrode 330 and the second common electrode 350 face the first substrate assembly 200. The multiple first driving transistors 130 correspond to the multiple first common electrodes 330 in location, and the multiple second driving transistors 150 correspond to the multiple second common electrodes 350 in location. Thus, the on-state current flowing through the second driving transistor 150 is greater than the on-state current flowing through the first driving transistor 130, such that the transmittance of the second region 102 is greater than the transmittance of the first region 101. The potential of the second common electrode 350 can be adjusted to be lower than the potential of the first common electrode 330, such that the transmittance of the second region 102 is greater than the transmittance of the first region 101. Through the above two manners, the difference between the intensity of the light received at the first region 101 and the intensity of the light received at the second region 102 can be eliminated, to further make the brightness of the light-exiting side of the second region 102 consistent with the brightness of the light-exiting side of the first region 101, ensuring display uniformity of the display panel 10.

Overall, the disclosure aims to provide a display panel and a method for manufacturing the same, and a display device having the display panel. The disclosure aims to solve the problem that a dark zone appears on the display panel due to nonuniform backlight provided by a backlight module in the related art.

To solve the problem, embodiments of the disclosure provide a display panel. The display panel includes at least one first region and at least one second region, where a brightness of light received at the first region is greater than a brightness of light received at the second region. The display panel includes a first substrate assembly and a second substrate assembly opposite to the first substrate assembly. The first substrate assembly includes a first substrate, multiple first driving transistors, and multiple second driving transistors, where the multiple first driving transistors and the multiple second driving transistors are disposed on one side of the first substrate facing the second substrate assembly, the multiple first driving transistors are located in the at least one first region, and the multiple second driving transistors are located in the at least one second region. The first driving transistor includes a first source and a first drain spaced apart from the first source, the second driving transistor includes a second source and a second drain spaced apart from the second source, the first source or the first drain has a first width, the first source and the first drain are spaced apart by a first spacing, the second source or the second drain has a second width, the second source and the second drain are spaced apart by a second spacing, and a ratio of the second width to the second spacing is greater than a ratio of the first width to the first spacing.

In conclusion, the display panel provided in embodiments of the disclosure includes the at least one first region and the at least one second region, where the brightness of the light received at the first region is greater than the brightness of the light received at the second region. The display panel includes the first substrate assembly and the second substrate assembly opposite to the first substrate assembly. The first substrate assembly includes the multiple first driving transistors located in the at least one first region and the multiple second driving transistors located in the at least one second region. The first source or the first drain of the first driving transistor has the first width, the first source and the first drain are spaced apart by the first spacing, the second source or the second drain of the second driving transistor has the second width, the second source and the second drain are spaced apart by the second spacing, and the ratio of the second width to the second spacing is greater than the ratio of the first width to the first spacing. As such, an on-state current flowing through the second driving transistor is greater than an on-state current flowing through the first driving transistor. Since the on-state current flowing through the second driving transistor is greater than the on-state current flowing through the first driving transistor, a transmittance of the second region is greater than a transmittance of the first region, to compensate for a difference between an intensity of the light received at the first region and an intensity of the light received at the second region. As such, a brightness of a light-exiting side of the second region is consistent with a brightness of a light-exiting side of the first region, thereby ensuring display uniformity of the display panel.

In exemplary implementations, the second substrate assembly includes a second substrate, at least one first common electrode, and at least one second common electrode, the first common electrode and the second common electrode are disposed on one side of the second substrate facing the first substrate assembly, the first common electrode is located in the first region, the second common electrode is located in the second region, and the second common electrode has a potential lower than the first common electrode.

In exemplary implementations, the first substrate assembly further includes an insulating layer and a passivation layer, each of the multiple first driving transistors further includes a first active layer and a first gate, each of the multiple second driving transistors further includes a second active layer and a second gate, and the insulating layer covers the first gate and the second gate on the first substrate. The first active layer and the second active layer are disposed on one side of the insulating layer away from the first substrate, the first source and the first drain are disposed on one side of the first active layer away from the insulating layer, the second source and the second drain are disposed on one side of the second active layer away from the insulating layer, and the passivation layer covers the first source, the first drain, the first active layer, the second source, the second drain, and the second active layer on the insulating layer.

In exemplary implementations, the first substrate assembly further includes a color resist layer and a planarization layer, and the color resist layer is disposed on one side of the passivation layer away from the insulating layer and the planarization layer is disposed on one side of the color resist layer away from the passivation layer.

In exemplary implementations, the first common electrode is coupled with a driving chip through a first chip-on-film, and an array substrate common electrode in the first region is coupled with the driving chip through a third chip-on-film.

The second common electrode is coupled with the driving chip through a second chip-on-film, and an array substrate common electrode in the second region is coupled with the driving chip through the third chip-on-film.

In exemplary implementations, the second width is greater than the first width and the second spacing is equal to the first spacing. Alternatively, the second width is equal to the first width and the second spacing is less than the first spacing. Alternatively, the second width is greater than the first width and the second spacing is less than the first spacing.

In exemplary implementations, the ratio of the second width to the second spacing is greater than or equal to 4 and less than 7 and the ratio of the first width to the first spacing is greater than or equal to 3 and less than or equal to 4.

Based on the same inventive concept, embodiments of the disclosure provide a display device. The display device includes the display panel above and a backlight module configured to provide light for the display panel.

In conclusion, the display device of the embodiments of the disclosure includes the backlight module and the display panel. The display panel includes the at least one first region and the at least one second region, where the brightness of the light received at the first region is greater than the brightness of the light received at the second region. The display panel includes the first substrate assembly and the second substrate assembly opposite to the first substrate assembly. The first substrate assembly includes the multiple first driving transistors located in the at least one first region and the multiple second driving transistors located in the at least one second region. The first source or the first drain of the first driving transistor has the first width, the first source and the first drain are spaced apart by the first spacing, the second source or the second drain of the second driving transistor has the second width, the second source and the second drain are spaced apart by the second spacing, and the ratio of the second width to the second spacing is greater than the ratio of the first width to the first spacing. As such, an on-state current flowing through the second driving transistor is greater than an on-state current flowing through the first driving transistor. Since the on-state current flowing through the second driving transistor is greater than the on-state current flowing through the first driving transistor, a transmittance of the second region is greater than a transmittance of the first region, to compensate for a difference between intensities of the light emitted by the light source received by the first region and the second region. As such, a brightness of a light-exiting side of the second region is consistent with a brightness of a light-exiting side of the first region, thereby ensuring display uniformity of the display panel.

Based on the same inventive concept, embodiments of the disclosure provide a method for manufacturing a display panel. The method is for manufacturing the display panel above and includes the following.

The first substrate is provided and the multiple first driving transistors and the multiple second driving transistors are formed on the first substrate, to form the first substrate assembly, where the first source or the first drain of each first driving transistor has the first width, the first source and the first drain are spaced apart by the first spacing, the second source or the second drain of each second driving transistor has the second width, the second source and the second drain are spaced apart by the second spacing, and the ratio of the second width to the second spacing is greater than the ratio of the first width to the first spacing.

The second substrate is provided and the at least one first common electrode and the at least one second common electrode are formed on one side of the second substrate, to form the second substrate assembly.

The first substrate assembly and the second substrate assembly are aligned to form the display panel, where the first common electrode and the second common electrode face the first substrate assembly.

In exemplary implementations, providing the first substrate and forming on the first substrate the multiple first driving transistors and the multiple second driving transistors, to form the first substrate assembly includes the following.

Multiple first gates, multiple second gates, and the insulating layer are formed on the first substrate, where the insulating layer covers the multiple first gates and the multiple second gates on the first substrate.

Multiple first active layers, multiple second active layers, multiple first sources, multiple second sources, multiple first drains, multiple second drains, and the passivation layer are formed on the insulating layer, where the passivation layer covers the multiple first active layers, the multiple second active layers, the multiple first sources, the multiple second sources, the multiple first drains, and the multiple second drains on the insulating layer.

The color resist layer and the planarization layer are sequentially formed on a surface of the passivation layer away from the insulating layer.

Multiple via holes which penetrate the planarization layer and the color resist layer and extend into the passivation layer are defined, to make the multiple first drains and the multiple second drains expose from the passivation layer, and a multiple pixel electrodes are formed, where the multiple pixel electrodes extend into the via holes from a surface of the planarization layer away from the color resist layer and are electrically connected with the multiple first drains and the multiple second drains.

In conclusion, the method for manufacturing the display panel provided in embodiments of the disclosure includes the following. The first substrate is provided and the multiple first driving transistors and the multiple second driving transistors are formed on the first substrate, to form the first substrate assembly, where the first source or the first drain of each first driving transistor has the first width, the first source and the first drain are spaced apart by the first spacing, the second source or the second drain of each second driving transistor has the second width, the second source and the second drain are spaced apart by the second spacing, and the ratio of the second width to the second spacing is greater than the ratio of the first width to the first spacing. The second substrate is provided and the at least one first common electrode and the at least one second common electrode are formed on one side of the second substrate, to form the second substrate assembly. The first substrate assembly and the second substrate assembly are aligned to form the display panel, where the first common electrode and the second common electrode face the first substrate assembly. Since the ratio of the second width to the second spacing is greater than the ratio of the first width to the first spacing, an on-state current flowing through the second driving transistor is greater than an on-state current flowing through the first driving transistor, and a transmittance of the second region is greater than a transmittance of the first region, to compensate for a difference between intensities of the light emitted by the light source received by the first region and the second region. As such, a brightness of a light-exiting side of the second region is consistent with a brightness of a light-exiting side of the first region, thereby ensuring display uniformity of the display panel.

The flowchart of the disclosure is only an embodiment, and various modifications may be made to this illustration or the steps in the disclosure without departing from the spirit of the disclosure. For example, the steps may be performed in a different order, or a certain step may be added, deleted, or modified. Those skilled in the art can understand that, the all or part of the processes for realizing the above embodiments and the equivalent changes made according to the claims of the disclosure still belong to the scope covered by the disclosure.

In the description of this specification, the description of the reference terms "an implementation", "some implementations", "exemplary implementations", "examples", "specific examples" or "some examples", etc. mean that a particular feature, structure, material, or characteristic described in combination with the implementation or example is included in at least one implementation or example of the disclosure. In this specification, schematic representations of the above terms do not necessarily refer to the same implementation or example. Furthermore, the particular features, structures, materials, or characteristics described may be combined in a suitable manner in any one or more implementations or examples.

It should be understood that, the application of the disclosure is not limited to the above-mentioned examples, and those of ordinary skill in the art can make improvements or changes according to the above description, and all these improvements and changes should belong to the protection scope of the appended claims of the disclosure. Those of ordinary skill in the art can understand that, all or part of methods for realizing the above embodiments and the equivalent changes made according to the claims of the disclosure still belong to the scope of the disclosure.

What is claimed is:

1. A display panel, comprising at least one first region and at least one second region, a brightness of light received at the first region being greater than a brightness of light received at the second region, the display panel comprising a first substrate assembly and a second substrate assembly opposite to the first substrate assembly, wherein the first substrate assembly comprises a first substrate, a plurality of first driving transistors, and a plurality of second driving transistors, wherein the plurality of first driving transistors and the plurality of second driving transistors are disposed on one side of the first substrate facing the second substrate assembly, the plurality of first driving transistors are located in the at least one first region, and the plurality of second driving transistors are located in the at least one second region; and the first driving transistor comprises a first source and a first drain spaced apart from the first source, the second driving transistor comprises a second source and a second drain spaced apart from the second source, the first source or the first drain has a first width, the first source and the first drain are spaced apart by a first spacing, the second source or the second drain has a second width, the second source and the second drain are spaced apart by a second spacing, and a ratio of the second width to the second spacing is greater than a ratio of the first width to the first spacing.

2. The display panel of claim 1, wherein the second substrate assembly comprises a second substrate, at least one first common electrode, and at least one second common electrode, the first common electrode and the second common electrode are disposed on one side of the second substrate facing the first substrate assembly, the first common electrode is located in the first region, the second common electrode is located in the second region, and the second common electrode has a potential lower than the first common electrode.

3. The display panel of claim 2, wherein
the first common electrode is coupled with a driving chip through a first chip-on-film, and an array substrate common electrode in the first region is coupled with the driving chip through a third chip-on-film; and
the second common electrode is coupled with the driving chip through a second chip-on-film, and an array substrate common electrode in the second region is coupled with the driving chip through the third chip-on-film.

4. The display panel of claim 1, wherein
the first substrate assembly further comprises an insulating layer and a passivation layer, each of the plurality of first driving transistors further comprises a first active layer and a first gate, each of the plurality of second driving transistors further comprises a second active layer and a second gate, and the insulating layer covers the first gate and the second gate on the first substrate; and
the first active layer and the second active layer are disposed on one side of the insulating layer away from the first substrate, the first source and the first drain are disposed on one side of the first active layer away from the insulating layer, the second source and the second drain are disposed on one side of the second active layer away from the insulating layer, and the passivation layer covers the first source, the first drain, the first active layer, the second source, the second drain, and the second active layer on the insulating layer.

5. The display panel of claim 4, wherein the first substrate assembly further comprises a color resist layer and a planarization layer, and the color resist layer is disposed on one side of the passivation layer away from the insulating layer and the planarization layer is disposed on one side of the color resist layer away from the passivation layer.

6. The display panel of claim 1, wherein
the second width is greater than the first width and the second spacing is equal to the first spacing;
the second width is equal to the first width and the second spacing is less than the first spacing; or
the second width is greater than the first width and the second spacing is less than the first spacing.

7. The display panel of claim 1, wherein the ratio of the second width to the second spacing is greater than or equal to 4 and less than 7 and the ratio of the first width to the first spacing is greater than or equal to 3 and less than or equal to 4.

8. The display panel of claim 1, further comprising a liquid crystal layer, wherein the liquid crystal layer is disposed between the first substrate assembly and the second substrate assembly and comprises a plurality of post spacers arranged in an array and a plurality of liquid crystals, and each liquid crystal is disposed between adjacent post spacers.

9. The display panel of claim 8, further comprising a black matrix layer, wherein the black matrix layer is disposed at one side of the second substrate assembly facing the liquid crystal layer and comprises a plurality of light shielding blocks arranged in an array, and wherein the light shielding block is disposed at one side of the post spacer facing the second substrate assembly and is used to shield light to prevent light passing through adjacent sub-pixel units from interfering with each other.

10. A display device comprising a backlight module and a display panel, the backlight module being configured to provide light for the display panel and the display panel comprising at least one first region and at least one second region, a brightness of light received at the first region being greater than a brightness of light received at the second region, the display panel comprising a first substrate assembly and a second substrate assembly opposite to the first substrate assembly, wherein
the first substrate assembly comprises a first substrate, a plurality of first driving transistors, and a plurality of second driving transistors, wherein the plurality of first driving transistors and the plurality of second driving transistors are disposed on one side of the first substrate facing the second substrate assembly, the plurality of first driving transistors are located in the at least one first region, and the plurality of second driving transistors are located in the at least one second region; and
the first driving transistor comprises a first source and a first drain spaced apart from the first source, the second driving transistor comprises a second source and a second drain spaced apart from the second source, the first source or the first drain has a first width, the first source and the first drain are spaced apart by a first spacing, the second source or the second drain has a second width, the second source and the second drain are spaced apart by a second spacing, and a ratio of the second width to the second spacing is greater than a ratio of the first width to the first spacing.

11. The display device of claim 10, wherein the backlight module comprises a backplane, an optical film assembly, and lamp panels, wherein
the optical film assembly is installed on the backplane and encloses an accommodating space with the backplane, and is used to make the light provided by the backlight module uniform and improve a brightness of the light provided by the backlight module,
the lamp panels are disposed in the accommodating space and installed on the backplane, and are used to emit light.

12. The display device of claim 11, wherein the lamp panels are spaced apart from one another and two adjacent lamp panels are spaced apart by a splicing-gap region, wherein a brightness of the splicing-gap region is lower than a brightness of a region where the lamp panel is located.

13. The display device of claim 10, wherein the second substrate assembly comprises a second substrate, at least one first common electrode, and at least one second common electrode, the first common electrode and the second common electrode are disposed on one side of the second substrate facing the first substrate assembly, the first common electrode is located in the first region, the second common electrode is located in the second region, and the second common electrode has a potential lower than the first common electrode.

14. The display device of claim 13, wherein
the first common electrode is coupled with a driving chip through a first chip-on-film, and an array substrate common electrode in the first region is coupled with the driving chip through a third chip-on-film; and the second common electrode is coupled with the driving chip through a second chip-on-film, and an array substrate common electrode in the second region is coupled with the driving chip through the third chip-on-film.

15. The display device of claim 10, wherein
the first substrate assembly further comprises an insulating layer and a passivation layer, each of the plurality of first driving transistors further comprises a first active layer and a first gate, each of the plurality of second driving transistors further comprises a second active layer and a second gate, and the insulating layer covers the first gate and the second gate on the first substrate; and
the first active layer and the second active layer are disposed on one side of the insulating layer away from the first substrate, the first source and the first drain are disposed on one side of the first active layer away from the insulating layer, the second source and the second drain are disposed on one side of the second active layer away from the insulating layer, and the passivation layer covers the first source, the first drain, the first active layer, the second source, the second drain, and the second active layer on the insulating layer.

16. The display device of claim 15, wherein the first substrate assembly further comprises a color resist layer and a planarization layer, and the color resist layer is disposed on one side of the passivation layer away from the insulating layer and the planarization layer is disposed on one side of the color resist layer away from the passivation layer.

17. The display device of claim 10, wherein
the second width is greater than the first width and the second spacing is equal to the first spacing;
the second width is equal to the first width and the second spacing is less than the first spacing; or
the second width is greater than the first width and the second spacing is less than the first spacing.

18. The display device of claim 10, wherein the ratio of the second width to the second spacing is greater than or equal to 4 and less than 7 and the ratio of the first width to the first spacing is greater than or equal to 3 and less than or equal to 4.

19. A method for manufacturing a display panel, for manufacturing the display panel comprising at least one first region and at least one second region, a brightness of light received at the first region being greater than a brightness of light received at the second region, and the method comprising:
providing a first substrate and forming on the first substrate a plurality of first driving transistors and a plurality of second driving transistors, to form a first substrate assembly, wherein the plurality of first driving transistors are located in the at least one first region, the plurality of second driving transistors are located in the at least one second region, a first source or a first drain of each first driving transistor has a first width, the first source and the first drain are spaced apart by a first spacing, a second source or a second drain of each second driving transistor has a second width, the second source and the second drain are spaced apart by a second spacing, and a ratio of the second width to the second spacing is greater than the ratio of the first width to the first spacing;
providing a second substrate and forming on one side of the second substrate at least one first common electrode and at least one second common electrode, to form a second substrate assembly, wherein the plurality of first driving transistors and the plurality of second driving transistors are disposed on one side of the first substrate facing the second substrate assembly,; and
aligning the first substrate assembly and the second substrate assembly to form the display panel, wherein the first common electrode and the second common electrode face the first substrate assembly.

20. The method of claim 19, wherein providing the first substrate and forming on the first substrate the plurality of first driving transistors and the plurality of second driving transistors, to form the first substrate assembly comprises:
forming on the first substrate a plurality of first gates, a plurality of second gates, and an insulating layer, wherein the insulating layer covers the plurality of first gates and the plurality of second gates on the first substrate;
forming on the insulating layer a plurality of first active layers, a plurality of second active layers, a plurality of first sources, a plurality of second sources, a plurality of first drains, a plurality of second drains, and a passivation layer, wherein the passivation layer covers the plurality of first active layers, the plurality of second active layers, the plurality of first sources, the plurality of second sources, the plurality of first drains, and the plurality of second drains on the insulating layer;
forming a color resist layer and a planarization layer sequentially on a surface of the passivation layer away from the insulating layer; and
defining a plurality of via holes which penetrate the planarization layer and the color resist layer and extend into the passivation layer, to make the plurality of first drains and the plurality of second drains expose from the passivation layer and forming a plurality of pixel electrodes, wherein the plurality of pixel electrodes extend into the plurality of via holes from a surface of the planarization layer away from the color resist layer and are electrically connected with the plurality of first drains and the plurality of second drains.

* * * * *